US009111870B2

(12) United States Patent
Vincent (10) Patent No.: US 9,111,870 B2
(45) Date of Patent: Aug. 18, 2015

(54) MICROELECTRONIC PACKAGES CONTAINING STACKED MICROELECTRONIC DEVICES AND METHODS FOR THE FABRICATION THEREOF

(71) Applicant: Michael B. Vincent, Chandler, AZ (US)

(72) Inventor: Michael B. Vincent, Chandler, AZ (US)

(73) Assignee: FREESCALE SEMICONDUCTOR INC., Austin, TX (US)

( * ) Notice: Subject to any disclaimer, the term of this patent is extended or adjusted under 35 U.S.C. 154(b) by 30 days.

(21) Appl. No.: 14/056,844

(22) Filed: Oct. 17, 2013

(65) Prior Publication Data

US 2015/0108661 A1     Apr. 23, 2015

(51) Int. Cl.
 *H01L 21/78*     (2006.01)
 *H01L 23/28*     (2006.01)
 *H01L 23/00*     (2006.01)
 *H01L 23/538*    (2006.01)

(52) U.S. Cl.
 CPC ............... *H01L 24/30* (2013.01); *H01L 21/78* (2013.01); *H01L 23/28* (2013.01); *H01L 23/5386* (2013.01); *H01L 24/83* (2013.01); *H01L 2224/3001* (2013.01); *H01L 2924/181* (2013.01)

(58) Field of Classification Search
 CPC ............... H01L 25/0657; H01L 2924/01079; H01L 2224/48091; H01L 2924/15311; H01L 2924/14
 See application file for complete search history.

(56) References Cited

U.S. PATENT DOCUMENTS

| | | | |
|---|---|---|---|
| 7,977,163 B1 | 7/2011 | Huemoeller et al. | |
| 8,304,913 B2 | 11/2012 | Nalla et al. | |
| 2003/0230804 A1* | 12/2003 | Kouno et al. | 257/734 |
| 2008/0111233 A1 | 5/2008 | Pendse | |
| 2009/0008765 A1* | 1/2009 | Yamano et al. | 257/690 |
| 2009/0239336 A1* | 9/2009 | Lee et al. | 438/107 |
| 2010/0081234 A1 | 4/2010 | Lytle | |
| 2013/0037950 A1 | 2/2013 | Yu et al. | |
| 2013/0154074 A1* | 6/2013 | Oh | 257/676 |

* cited by examiner

*Primary Examiner* — Hoai V Pham
*Assistant Examiner* — Long Le
(74) *Attorney, Agent, or Firm* — Ingrassia Fisher & Lorenz, P.C.

(57) ABSTRACT

Microelectronic packages and methods for fabricating microelectronic packages are provided. In one embodiment, the method includes encapsulating a device stack within a molded panel having a frontside and a backside. The device stack contains an upper semiconductor die and an interconnect buffer layer, which is formed over the upper semiconductor die and which is covered by the frontside of the molded panel. Material is removed from the frontside the molded panel to expose the interconnect buffer layer therethrough. One or more frontside redistribution layers are produced over the frontside of the molded panel and electrically coupled to the upper semiconductor die through the interconnect buffer layer. The molded panel is then singulated to yield a microelectronic package including a molded package body containing the device stack.

20 Claims, 11 Drawing Sheets

MICROELECTRONIC PACKAGES CONTAINING STACKED MICROELECTRONIC DEVICES AND METHODS FOR THE FABRICATION THEREOF

TECHNICAL FIELD

Embodiments of the present invention relate generally to microelectronic packaging and, more particularly, to microelectronic packages and methods for fabricating microelectronic packages containing stacked microelectronic devices.

BACKGROUND

Fan-Out Wafer Level Packaging ("FO-WLP") processes are well-known within the semiconductor industry for producing microelectronic packages having peripheral fan-out areas, which enlarge the surface area of the package frontside over which the contact array is formed. In an example of an FO-WLP packaging approach, a pick-and-place tool is used to position an array of semiconductor die within the central opening of a taped mold frame. An encapsulant is then dispensed into the mold frame and over the array of semiconductor die. The encapsulant is thermally cured to produce a molded panel in which the array of semiconductor die is embedded, and the taped mold frame is removed to reveal the frontside of the molded panel through which the semiconductor die are exposed. After backside grinding and additional curing of the panel, a carrier is attached to the panel backside to allow a number of build-up layers or Redistribution Layers ("RDL layers"), as well as a Ball Grid Array ("BGA") or other contact array, to be formed over the panel frontside and the die exposed therethrough. The RDL layers include successively-deposited dielectric layers in which a number of metal traces and plugs are formed to provide electrically-conductive paths between the bond pads of the embedded die and the overlying BGA. Finally, the molded panel is singulated to yield a number of microelectronic packages each containing a different encapsulated semiconductor die.

BRIEF DESCRIPTION OF THE DRAWINGS

At least one example of the present invention will hereinafter be described in conjunction with the following figures, wherein like numerals denote like elements, and.

For simplicity and clarity of illustration, the drawing figures illustrate the general manner of construction, and descriptions and details of well-known features and techniques may be omitted to avoid unnecessarily obscuring the exemplary and non-limiting embodiments of the invention described in the subsequent Detailed Description. It should further be understood that features or elements appearing in the accompanying figures are not necessarily drawn to scale unless otherwise stated. For example, the dimensions of certain elements or regions in the figures may be exaggerated relative to other elements or regions to improve understanding of embodiments of the invention.

DETAILED DESCRIPTION

The following Detailed Description is merely exemplary in nature and is not intended to limit the invention or the application and uses of the invention. Any implementation described herein as exemplary is not necessarily to be construed as preferred or advantageous over other implementations. Furthermore, there is no intention to be bound by any theory presented in the preceding Background or the following detailed description.

Terms such as "comprise," "include," "have," and the like are intended to cover non-exclusive inclusions, such that a process, method, article, or apparatus referred to as comprising, including, or having a list of elements is not necessarily limited to those elements, but may include other elements not expressly listed. The term "coupled," as appearing herein, is defined as directly or indirectly connected in an electrical or non-electrical manner. Furthermore, terms such as "over," "under," "on," and the like are utilized to indicate relative position between two structural elements or layers and not necessarily to denote physical contact between structural elements or layers. Thus, a first structure or layer may be described as fabricated "over" or "on" a second structure, layer, or substrate without indicating that the first structure or layer necessarily contacts the second structure, layer, or substrate due to, for example, presence of one or more intervening layers.

In the context of this document, the term "microelectronic device" is used in a broad sense to refer to an electronic device, component, or structure produced on a relatively small scale and amenable to packaging in the below-described manner. Microelectronic devices include, but are not limited to, integrated circuits formed on semiconductor die, Microelectromechanical Systems (MEMS) devices, passive electronic components (e.g., discrete resistors, capacitors, and inductors), optical devices, and other small scale electronic devices capable of providing processing, memory, sensing, radiofrequency, optical, and actuator functionalities, to list but a few examples. Microelectronic devices also include other discrete or separately-fabricated structures that can be integrated into the microelectronic package, such as prefabricated antenna structures. The terms "opposed" and "opposing" are utilized to describe the relative positioning of two packed microelectronic devices facing in substantially opposite directions, such as first and second semiconductor die facing toward the respective frontside and backside surfaces of the package in which they are contained. Such opposing devices preferably, but need not always align or overlap as taken through the thickness of the package; that is, as taken along an axis orthogonal to the package frontside or backside. Finally, the phrase "back-to-back" is utilized to refer to the positioning of two opposed microelectronic devices having at least a portion of their respective backsides (e.g., the non-contact bearing sides of the two semiconductor die) positioned within relatively close proximity, as taken along an axis orthogonal to the package frontside or backside.

Figure 1:
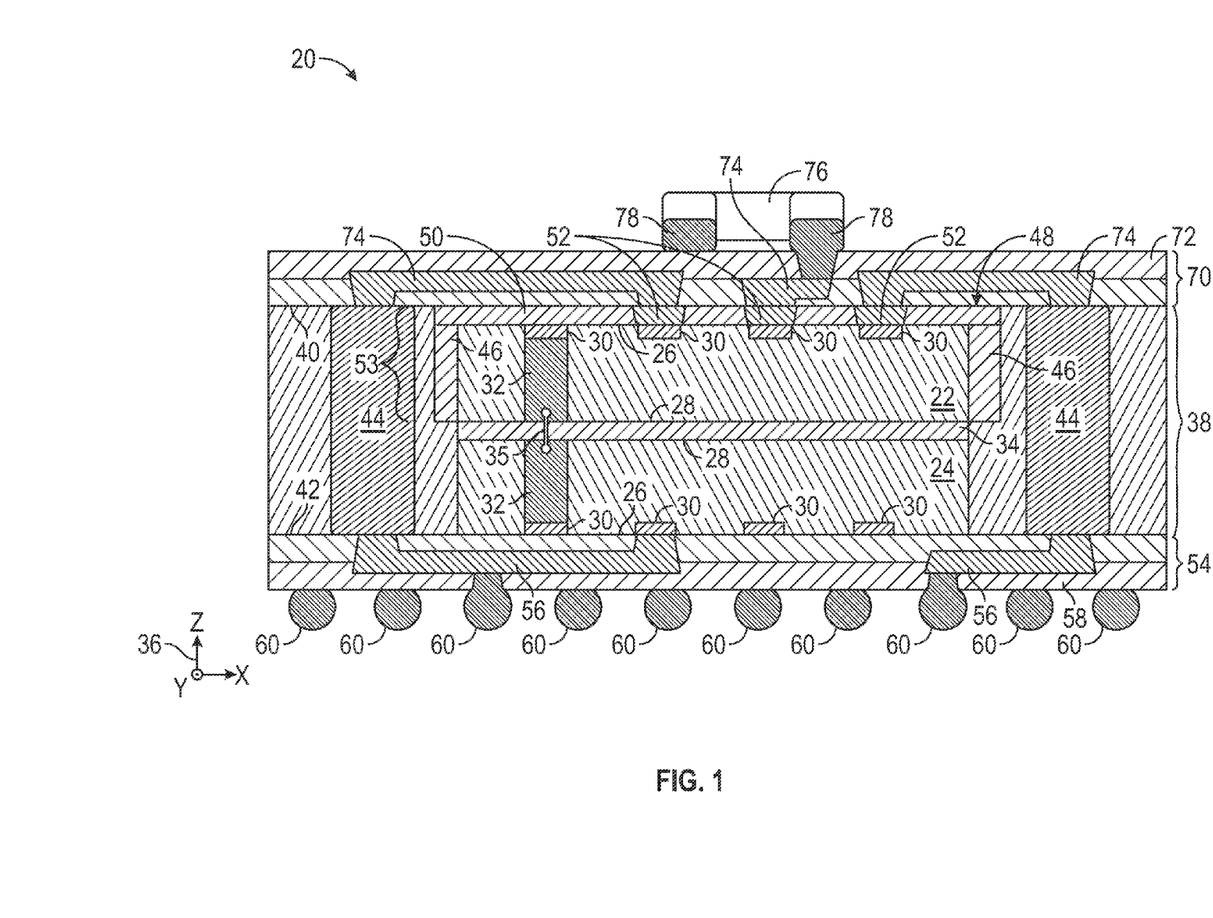
FIG. 1 is a cross-sectional view of a microelectronic package containing two stacked die positioned in a back-to-back relationship and embedded within an outer molded body, as illustrated in accordance with an exemplary embodiment of the present invention.

FIG. 1 is a cross-sectional view of a multi-device FO-WLP microelectronic package 20, as illustrated accordance with a first exemplary embodiment of the present invention. Microelectronic package 20 contains two embedded semiconductor die 22 and 24, which are positioned in a stacked or vertically overlapping relationship. Semiconductor die 22 and 24 each include an upper surface or "frontside" 26 and an opposing lower surface or "backside" 28. A number of bond pads 30 are located on the respective frontsides 26 of semiconductor die 22 and 24 to provide electrical contact to the integrated circuits formed thereon. Semiconductor die 22 and 24 may also be fabricated to include other features, such as one or more Through Silicon Vias ("TSVs") 32 to provide electrical connection between the respective frontside 26 and backside 28 of die 22 and 24. Semiconductor die 22 and 24 are positioned in a back-to-back relationship such that the respective frontsides 26 of die 22 and 24 face in opposing directions; that is, the frontside 26 of upper die 22 faces upward in the illustrated orientation, while the frontside 26 of lower inverted die 24 faces downward. It will be appreciated terms such as "upper," "lower," "upward," "downward," and the like are utilized in a non-limiting sense in reference to the illustrated orientation of microelectronic package 20 and with the understanding that package 20 may assume any orientation in three dimensional space. Die 22 and 24 may be collectively referred to as "microelectronic device stack 22, 24" or, more specifically, as "back-to-back die stack 22, 24" hereafter.

An intervening layer of die attach material 34 is disposed between and bonds the neighboring backsides 28 of semiconductor die 22 and 24 together. Die attach material 34 may be an electrically-insulative or electrically-conductive adhesive. For example, in embodiments wherein the respective backsides 28 of semiconductor die 22 and 24 lack electrically-conductive features, an electrically-conductive adhesive (e.g., a silver- or copper-filled epoxy) may be utilized as die attach material 34. Such an electrically-conductive adhesive may also have a relatively high thermal conductivity to allow conductive heat transfer across the die-to-die interface, which may improve heat dissipation from package 20. In further embodiments wherein electrically-conductive features are provided on backsides 28 of semiconductor die 22 and 24, an electrically-insulative adhesive (e.g., an alumina-filled epoxy) may be utilized to join die 22 and 24 to preserve electrical isolation between neighboring electrically-conductive features. In still further embodiments, it may be desirable to provide electrical interconnection between aligning electrically-conductive features located on the respective backsides 28 of die 22 and 24. In this case, an anisotropic paste or film can be utilized as die attach material 34. Such an anisotropic paste or film allows electrical conduction through the thickness of adhesive layer 34, while providing electrical insulation along the plane of layer 34 (that is, along the X-Y plane identified in FIG. 1 by coordinate legend 36). With respect to microelectronic package 20, specifically, usage of an anisotropic paste or film allows electrical interconnection between aligning TSVs 32 formed through die 22 and 24 (indicated in FIG. 1 by symbol 35), while preventing electrical bridging with other, non-illustrated TSVs, which may be formed in neighboring regions of die 22 and 24 and also electrically coupled through layer 34.

Semiconductor die 22 and 24 are embedded within an outer molded body 38 having a frontside 40 and an opposing backside 42. Outer molded body 38 may comprise a singulated piece of a larger molded panel (e.g., panel 100 shown in FIGS. 8-11), which is composed of an electrically-insulative mold compound. If desired, one or more Through Package Vias ("TPVs") 44 may also be formed through outer molded body 38 to provide signal routing between frontside 40 and backside 42 of body 38. In this case, and as indicated in FIG. 1, stacked die 22 and 24 may be contained within a central portion of outer molded body 38, while TPVs 44 are formed through an outer peripheral portion of body 38; however, this need not be the case in all embodiments. Upper die 22 is further embedded within or surrounded by an inner molded body 46, which is, in turn, embedded within or surrounded by outer molded body 38. Inner molded body 46 and outer molded body 38 may or may not be formed from the same electrically-insulative mold compound; however, inner molded body 46 is produced prior to outer molded body during an initial panelization and singulation process utilized to initially encapsulate die 22 (and possibly additional microelectronic components) within body 46, as described more fully below in conjunction with FIGS. 2-6.

An interconnect buffer layer 48 is formed over frontside 26 of upper die 22. Interconnect layer 48 is considered a "buffer layer" in that layer 48 serves to protect die 22 from damage during fabrication of microelectronic package 20 and, specifically, during material removal from the backside of the molded panel from which outer molded body 38 is produced. As will be described more fully below, material is preferably removed from the backside of the molded panel (e.g., molded panel 100 shown in FIGS. 8-11) utilizing a global planarization process during which an upper sacrificial upper portion of interconnect buffer layer 48 is removed. As a result of the below-described planarization process, interconnect buffer layer 48 and molded body 38 are imparted with co-planar upper surfaces having substantially planar or flat topologies. While protecting upper die 22 from damage during planarization of the molded panel, interconnect buffer layer 48 also provides electrical connection to bond pads 30 of die 22 to allow interconnection thereto subsequent to planarization. Interconnect buffer layer 48 may assume any form suitable for performing these functions. However, as indicated in FIG. 1, interconnect buffer layer 48 preferably comprises a dielectric layer or film 50 deposited or otherwise formed over the upper surfaces of semiconductor die 22 and inner molded body 46, as well as a number of electrically-conductive contacts 52 extending through film 50 to ohmically contact bond pads 30 of die 22. Furthermore, while contacts 52 may assume the form of any electrically-conductive structure or body suitable for providing electrical contact to bond pads 30, contacts 52 preferably assume the form of plated metal pillars and will consequently be referred to as "plated pillars 52" hereafter. One manner in which plated pillars 52 may be formed within dielectric film 50 of interconnect buffer layer 48 is discussed below in conjunction with FIG. 5. As further discussed below, the core region of package 20 can further be conceptually divided into a lower package layer comprised of lower semiconductor die 24; and an upper package layer 53 comprised of upper semiconductor die 22, inner molded body 46, and interconnect buffer layer 48.

With continued reference to the exemplary embodiment illustrated in FIG. 1, one or more backside RDL layers 54 are disposed over backside surface 42 of outer molded body 38 and, therefore, over frontside 26 of lower inverted die 24. Similarly, one or more frontside RDL layers 70 are further disposed over frontside 40 of outer molded body 38 and over the upper surface of interconnect buffer layer 48. Additionally, at least one contact array is formed over backside RDL layers 54, over frontside RDL layer 70, or over both backside and frontside RDL layers 54 and 70, respectively. In the illustrated example, microelectronic package 20 is produced to include a single contact array, namely, a backside BGA 60 including a plurality of solder balls deposited over the terminal or outermost layer (e.g., a solder mask or passivation layer) included within backside RDL layers 54. Backside RDL layers 54 include a dielectric body 58 in which a number of electrically-conductive interconnect lines 56 (e.g., metal traces, vias, metal plugs, etc.) have been formed. Backside interconnect lines 56 electrically couple bond pads 30 of lower inverted die 24 to the balls of BGA 60 and, perhaps, to one or more of TPVs 44. Frontside RDL layers 70 likewise include a dielectric body 72 in which a number of electrically-conductive interconnect lines 74 are formed. Frontside interconnect lines 74 may electrically couple upper semiconductor die 22 to lower semiconductor die 24 and/or to the balls of BGA 60 through frontside RDL layers 70, TPVs 44, and backside RDL layers 54. Additionally or alternatively, frontside interconnect lines 74 may electrically couple upper die 22 to a frontside contact array in alternative embodiments wherein such an array is formed over frontside or topside of microelectronic package 20.

It is possible to mount additional discrete microelectronic devices or package layers to the topside and/or to the bottomside of FO-WLP microelectronic package 20. For example, in the illustrated embodiment wherein a frontside contact array is not provided over frontside RDL layers 70, one or more microelectronic devices or packages may be disposed over the outer terminal RDL layer 70 and electrically coupled to one or both of the die included within back-to-back die stack 22, 24. Further emphasizing this point, FIG. 1 illustrates microelectronic package 20 as including at least one passive electronic device, specifically, a Surface Mount Device ("SMD") 76, disposed over frontside RDL layers 70. SMD 76 may be a two terminal chip capacitor, inductor, resistor, or diode, to list but a few examples. SMD 76 is electrically coupled to selected interconnect lines 74 included within frontside RDL layers 70 via contacts 78 formed through the outermost RDL layer 70. As a result, SMD 76 may be electrically coupled to upper semiconductor die 22 through frontside RDL layers 70 and interconnect buffer layer 48; to lower semiconductor die 24 through frontside RDL layers 70, TPVs 44, and backside RDL layers 54; and/or to BGA 60 through frontside RDL layers 70, TPVs 44, and backside RDL layers 54. In further embodiments, more than one SMD or other discrete microelectronic component may be disposed over backside RDL layers 54 and/or frontside RDL layers 70 and electrically interconnected to one or both of the semiconductor die contained within back-to-back die stack 22, 24 via the various electrically-conductive routing features included within package 20.

In view of the foregoing description, it should be appreciated that microelectronic package 20 contains a back-to-back die stack 22, 24 embedded within a relatively compact, molded body 38. Additional microelectronic devices can be integrated into package 20 by inclusion within back-to-back die stack 22, 24 (as discussed in more detail below in conjunction with FIGS. 12 and 13) and/or by attachment to the topside or bottomside of package 20 (as described above in conjunction with SMD 76). Furthermore, the microelectronic devices contained within package 20 can be interconnected in a number of different manners; e.g., die 22 and 24, as well as any other microelectronic devices included within stack 22, 24, can be electrically interconnected across die attach layer 34 and/or through outer molded body 38 of via TPVs 44, backside RDL layers 54, and frontside RDL layers 70. As a result, embodiments of microelectronic package 20 can advantageously be produced as a relatively dense, highly interconnected package. As a further advantage, microelectronic package 20 can be produced in parallel with a relatively large number of other microelectronic packages utilizing a highly efficient, panel-level fabrication process. An example of such a fabrication process will now be described in conjunction with FIGS. 2-11. While described below in conjunction with the manufacture of exemplary package 20, specifically, it is emphasized that the below-described fabrication method can be utilized to produce other types of multi-device FO-WLP packages, such as those described below in conjunction with FIGS. 12 and 13. Furthermore, the fabrication steps described below can be performed in alternative orders, certain steps may be omitted, and additional steps may be performed in alternative embodiments. Certain steps in the manufacture of microelectronic packages may be well-known and, in the interests of brevity, will only be mentioned briefly herein or will be omitted entirely without description of the well-known process details.

Figure 2:
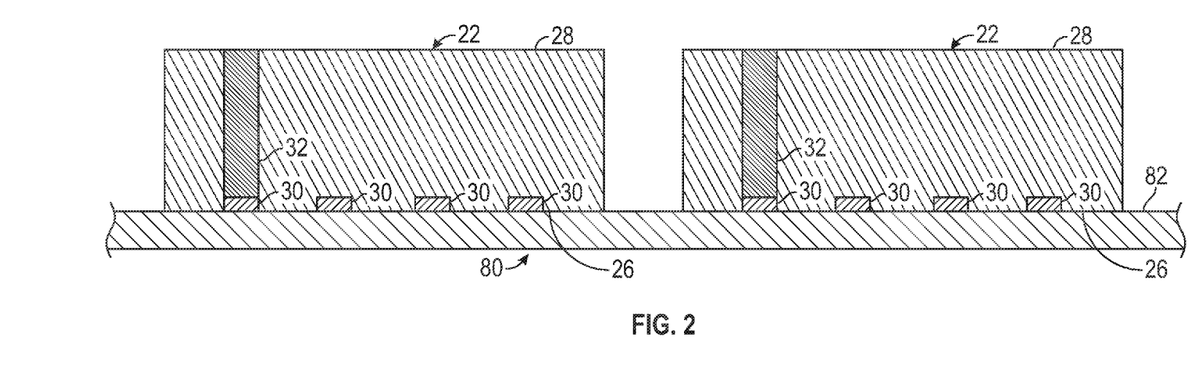
FIGS. 2-11 are cross-sectional views illustrating the microelectronic package shown in FIG. 1 at various stages of manufacture and produced in accordance with a first exemplary embodiment of the microelectronic package fabrication method.

FIGS. 2-11 illustrate FO-WLP microelectronic package 20 at various stages of completion and produced in parallel with a number of other microelectronic packages (one of which is shown in FIGS. 2-11), which may or may not be substantially identical to package 20. Referring initially to FIG. 2, there is shown two semiconductor die 22 disposed on a temporary substrate 80. At this juncture in the fabrication process, semiconductor die 22 have each undergone wafer-level processing to produce at least one semiconductor device (e.g., a number of transistors interconnected to form an integrated circuit) and bond pads 30 on their respective frontsides 26. Additionally, one or more TSVs 32 have been formed through the body of each die 22. Semiconductor die 22 have been inverted and placed facedown on temporary substrate 80 using, for example, a pick-and-place tool such that the bond pads 30 of each die 22 contact the upper surface of substrate 80. Only a relatively small portion of temporary substrate 80 supporting the illustrated semiconductor die 22 is shown in FIG. 1 to avoid unnecessarily obscuring the drawings; temporary substrate 80 will typically be considerably larger than the illustrated portion, and a relatively large number of semiconductor die may be distributed over the upper surface of substrate 80 in a grid array or other spatial arrangement along with die 22. As described below in conjunction with FIG. 5, interconnect buffer layer 48 is preferably formed subsequent to panelization of die 22 and is consequently not shown in FIG. 2; it should be noted, however, that interconnect buffer layer 48 may be formed over die 22 during wafer level processing (e.g., utilizing the below-described deposition, patterning, and plating techniques performed globally across the wafer) in further embodiments, in which case layer 48 would be present on die 22 and would be placed in contact substrate 80 at the stage of manufacture shown in FIG. 2.

Temporary substrate 80 can be any body, structure, or platform suitable for supporting die 22 and the other non-illustrated semiconductor die during encapsulation within a molded panel (also commonly referred to as "panelization" or "overmolding"). In one embodiment, temporary substrate 80 is a taped molded frame, which includes a soft tape adhesive layer 82 onto which die 22 have been placed. A non-illustrated mold frame, which has a central cavity or opening therein, is positioned over tape layer 82 and around the semiconductor die disposed thereon. An electrically-insulative encapsulant or mold compound, such as a silica-filled epoxy, is dispensed into the cavity of the mold frame. The encapsulant flows over and around semiconductor die 22 and the other die placed on tape layer 82. Sufficient volume of the encapsulant is typically dispensed over the die to enable the encapsulant to flow over the backside or non-contact-bearing surfaces of the semiconductor. The encapsulant may then solidified by thermal curing (e.g., heating in a partially-evacuated chamber) to yield a solid molded panel in which semiconductor die 22 are embedded. The molded panel is conveniently produced as a relatively thin, disc-shaped body or mass having a generally circular planform geometry; however, the panel body can be fabricated to have any desired shape and dimensions. In other embodiments, the molded panel can be produced utilizing various other known fabrication techniques including, for example, compression molding and lamination processes.

Figure 3:
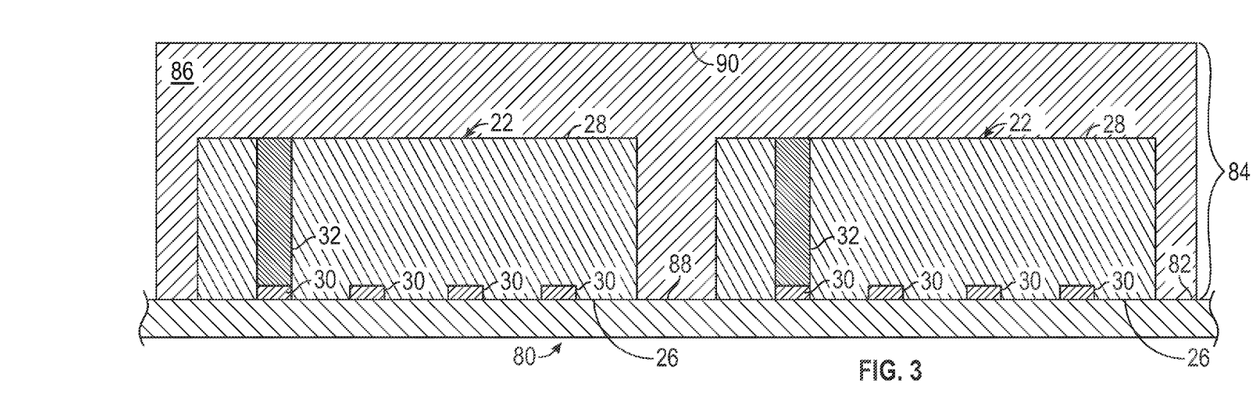
Figure 4:
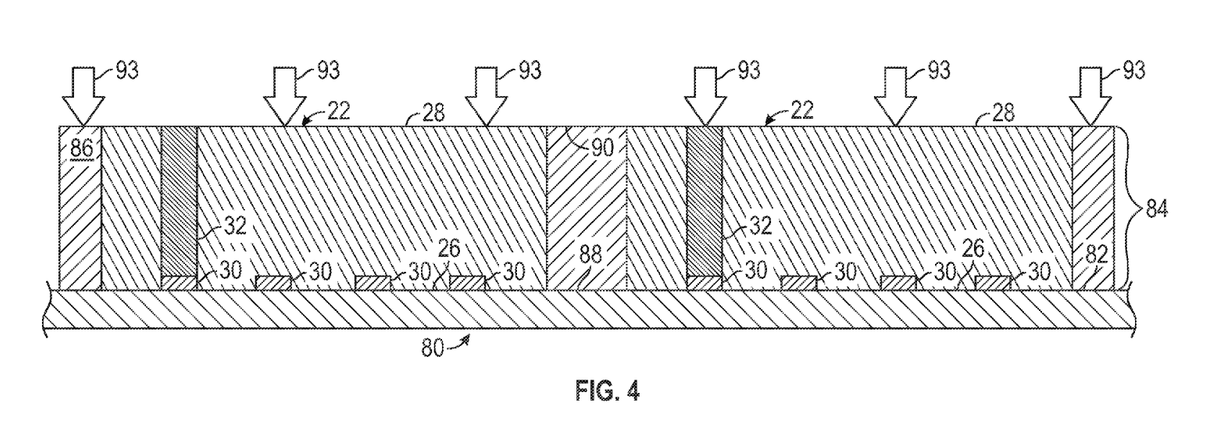

FIG. 3 illustrates a portion of an exemplary molded panel 84, which may be produced pursuant to above-described encapsulation process. Again, only a small portion of molded panel 84 containing semiconductor die 22 is shown in FIG. 3 for clarity with the understanding that the non-illustrated portion of molded panel 84 may contain a relatively large number of additional semiconductor die. Molded panel 84 includes a body 86 having a frontside surface 88 and an opposing bottomside surface 90. After formation of panel 84, the backside 90 of molded panel 84 is planarized to remove material therefrom and expose the respective backsides 28 of die 22 (and the other die embedded within panel 84). Backside planarization of panel 84 is represented in FIG. 4 by arrows 93 and may be carried-out utilizing, for example, a grinding and/or CMP process. Planarization of panel 84 imparts backside 90 with a substantially planar topology; that is, a relatively smooth surface having a surface roughness less than about 10 μm, preferably less than about 5 μm, and still more preferably less than about 1 μm. In addition to exposing die 22 through the backside 90 of panel 84, planarization may also result in some material removal from the respective backsides 28 of die 22; however, a certain amount of removal from the backsides 28 of semiconductor die 22 can occur without damage to die 22 and is consequently permissible. After panel planarization, molded panel 84 may be released from temporary substrate 80 to reveal frontside surface 88 of panel body 86 through which the respective frontsides 26 of semiconductor die 22 are exposed. Additional curing of molded panel 84 (e.g., a final oven bake) may be performed, if needed, prior to release of panel 84 from substrate 80. If desired, one more cleaning steps may be performed after panel release to remove any adhesive residue remaining on frontside surface 88 of molded panel 84.

Figure 5:
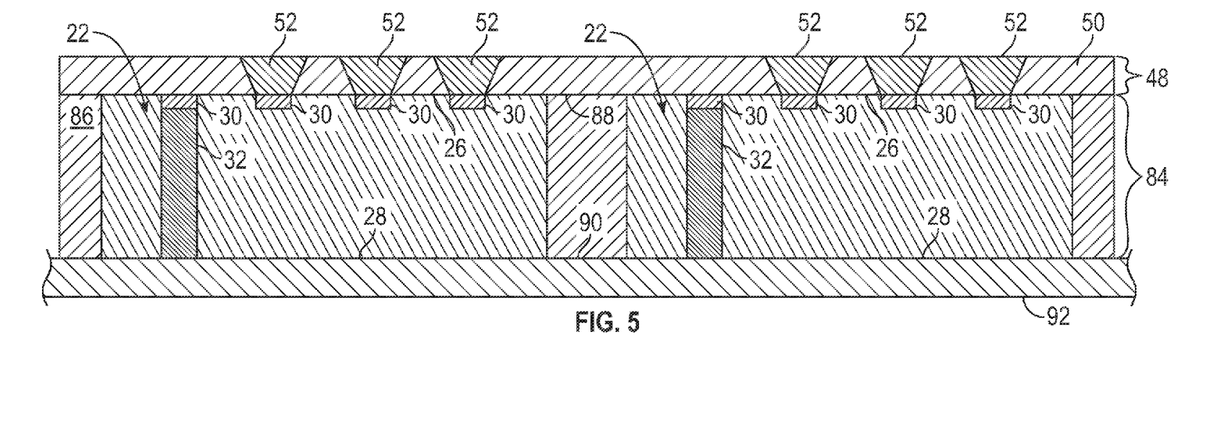

Next, as indicated in FIG. 5, molded panel 84 may be inverted and attached to a temporary carrier 92 for the production of interconnect buffer layer 48 over frontside 88 of molded panel 84 and the respective frontsides 26 of semiconductor die 22. As indicated above, interconnect buffer layer 48 may be produced to include at least one dielectric layer 50 through which a plurality of plated pillars 52 or other contacts extend. In one embodiment, plated pillars 52 are produced by first coating the newly-planarized backside 90 of molded panel 84 with one or more layers of photoresist, lithographically patterning the photoresist to create openings to bond pads 30, sputtering, and then utilizing a copper or other metal plating process to deposit pillars 52. As shown in FIG. 5, plated pillars 52 may be exposed through the outermost surface of interconnect buffer layer 48 after production thereof. Alternatively, an additional layer of dielectric material (not shown) may also be deposited over plated pillars 52 and dielectric layer 50 to create a more uniform or regular upper surface, which may aid in further processing or placement of die 22 utilizing a pick-and-place tool. In this case, such an additional, overlying layer of dielectric material will be removed during the planarization or polishing process described below in conjunction with FIG. 9. Similarly, in still further embodiments, an initial planarization or polishing process may be performed prior to stacking of die 22 to impart interconnect buffer layer 48 with a substantially planar topology, if needed or desired. Finally, as noted above, interconnect buffer layer 48 may alternatively be produced prior to encapsulation of die 22 in still further embodiments and, specifically, during wafer level processing of the semiconductor wafer utilized to produce die 22. In this latter case, interconnect buffer layer 48 may still be produced utilizing processing steps similar to or identical to those described above.

Figure 6:
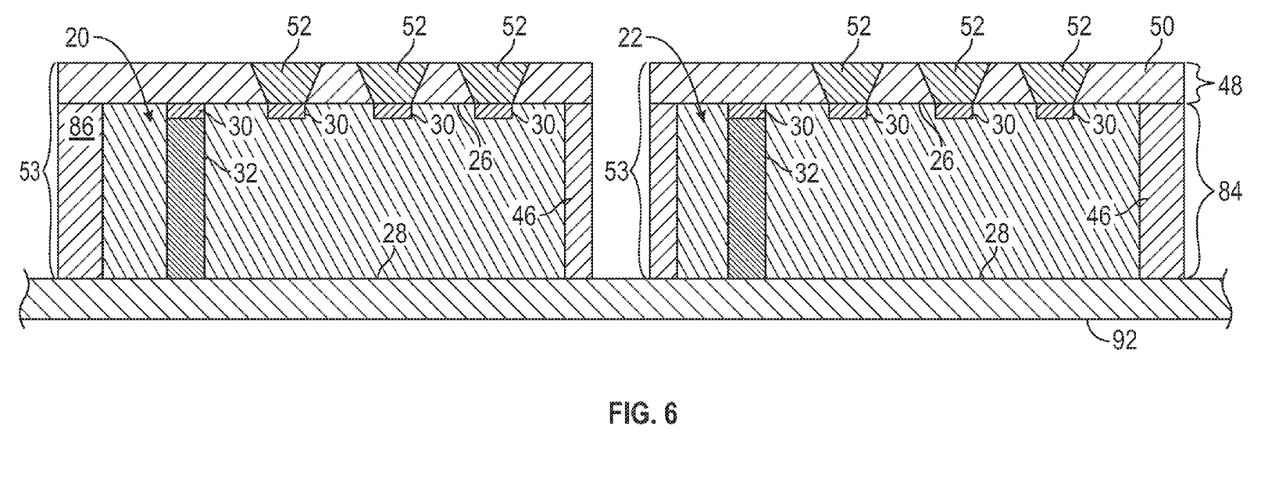

After the production of interconnect buffer layer 48, molded panel 84 may be singulated to separate panel 84 into a number of discrete, partially-completed core packages. The microelectronic packages are partially-fabricated or incomplete in the sense they lack a final capping or passivation layer on which a BGA or other external contact array is formed. The resultant structure is shown in FIG. 6 wherein the partially completed core packages are identified by reference numerals "53." As partially-fabricated packages will be incorporated into an upper portion of FO-WLP microelectronic package 20 (FIG. 1), these partially-completed packages are each referred to herein as "upper package layers 53." As can be seen in FIG. 6, upper package layers 53 each include a molded body 46, a semiconductor die 22 embedded within the molded body 46, and an interconnect buffer layer 48 formed over the molded body 46 and embedded die 22. Upper package layers 53 may be tested immediately prior to or subsequent to singulation; and only known-good packages may be used moving forward with latter stages of the below-described packaging process.

Figure 7:
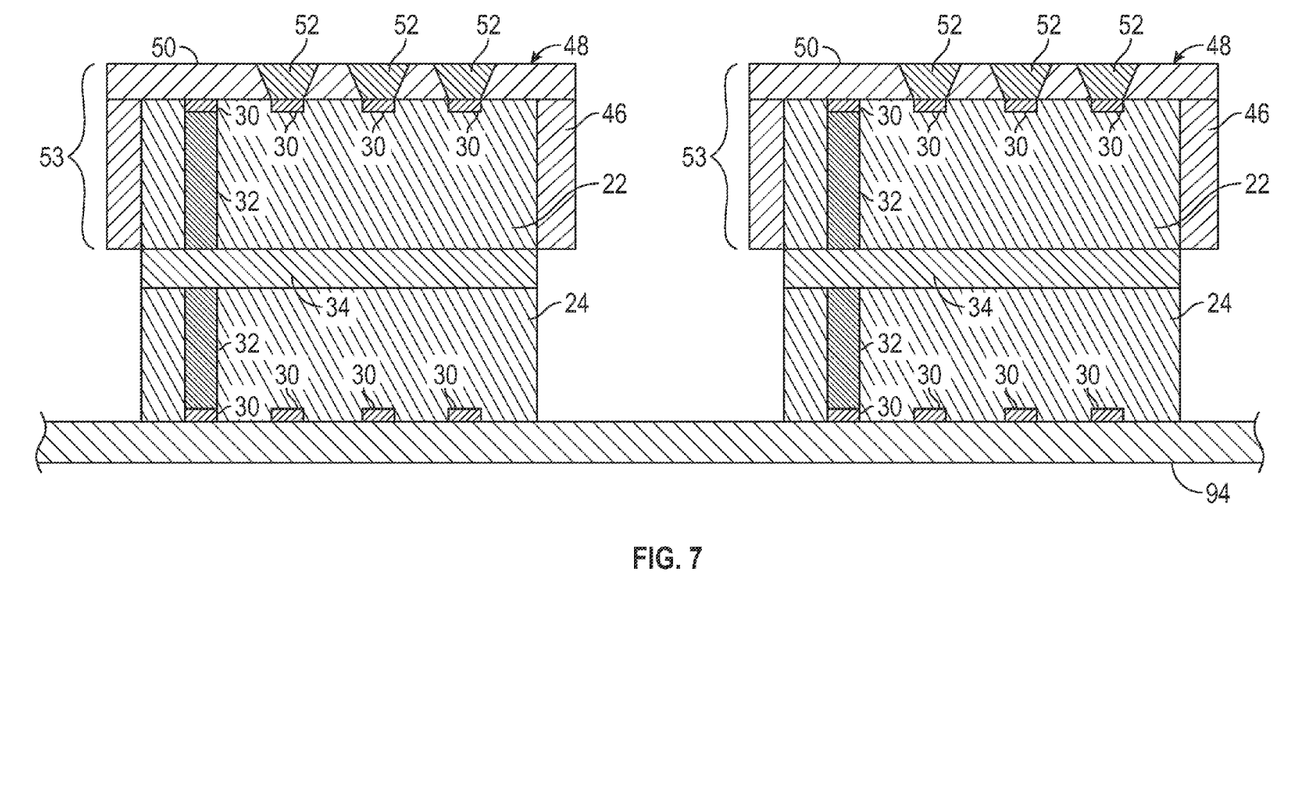

Upper package layers 53 are next released from temporary substrate 92 and stacked onto one or more additional microelectronic devices in preparation for a secondary encapsulation or panelization process. For example, as shown in FIG. 7, upper package layers 53 may each be stacked onto a semiconductor die 24 supported by a temporary substrate 94 (e.g., a second taped mold frame). Upper package layers 53 and, specifically, die 22 contained within package layers 53 are positioned in a back-to-back relationship with lower semiconductor die 24, which may be inverted when placed onto substrate 94. While the possibility that upper packages layer 53 may be placed in intimate contact with lower semiconductor die 24 is by no means precluded, it is generally preferred that at least one layer of die attach material 34 is disposed between package layers 53 and underlying die 24; e.g., die attach material 34 may be dispensed onto the backsides of lower die 24 prior to placement of upper package layers 53 thereon. As noted above in conjunction with FIG. 1, die attach material 34 may be an electrically-conductive adhesive, an electrically-insulative adhesive, or an electrically-anisotropic adhesive film. As indicated in FIG. 7, the planform dimensions of upper semiconductor die 22 and lower semiconductor die 24 may be substantially identical such that molded bodies 46 project laterally beyond lower die 24 when upper package layers 53 are stacked onto die 22; however, this need not be the case in all embodiments, and the planform dimensions and shapes of semiconductor die 22 and 24 may vary such that die 22 is larger or smaller than die 24.

Figure 8:
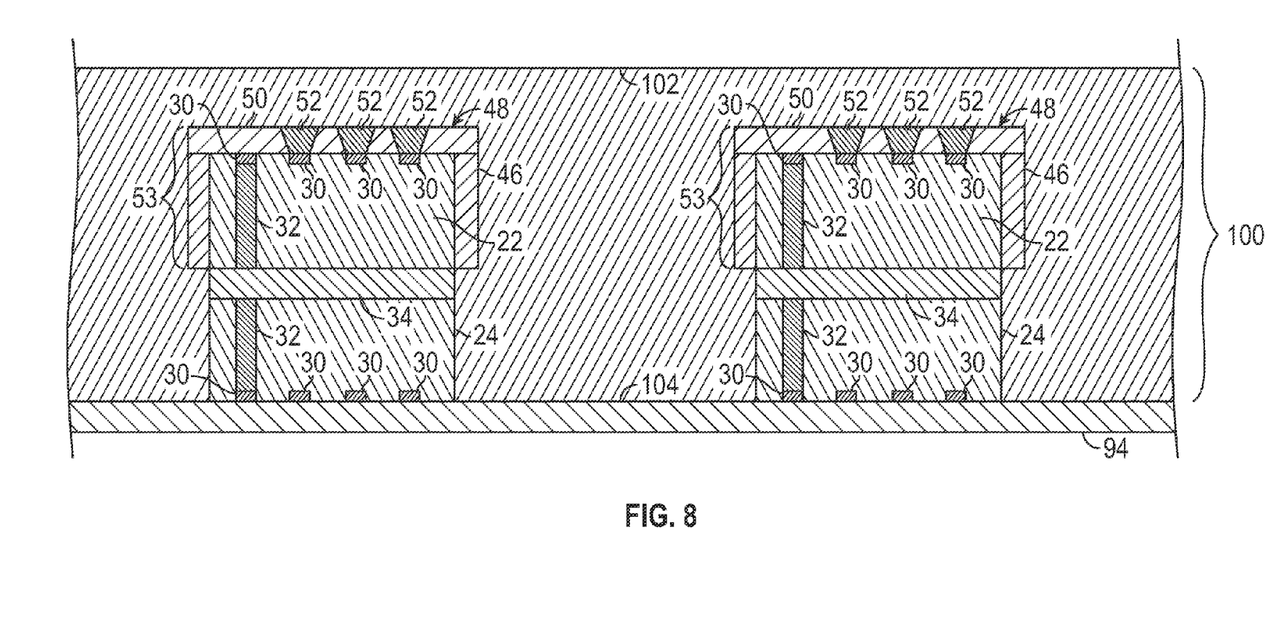
Figure 9:
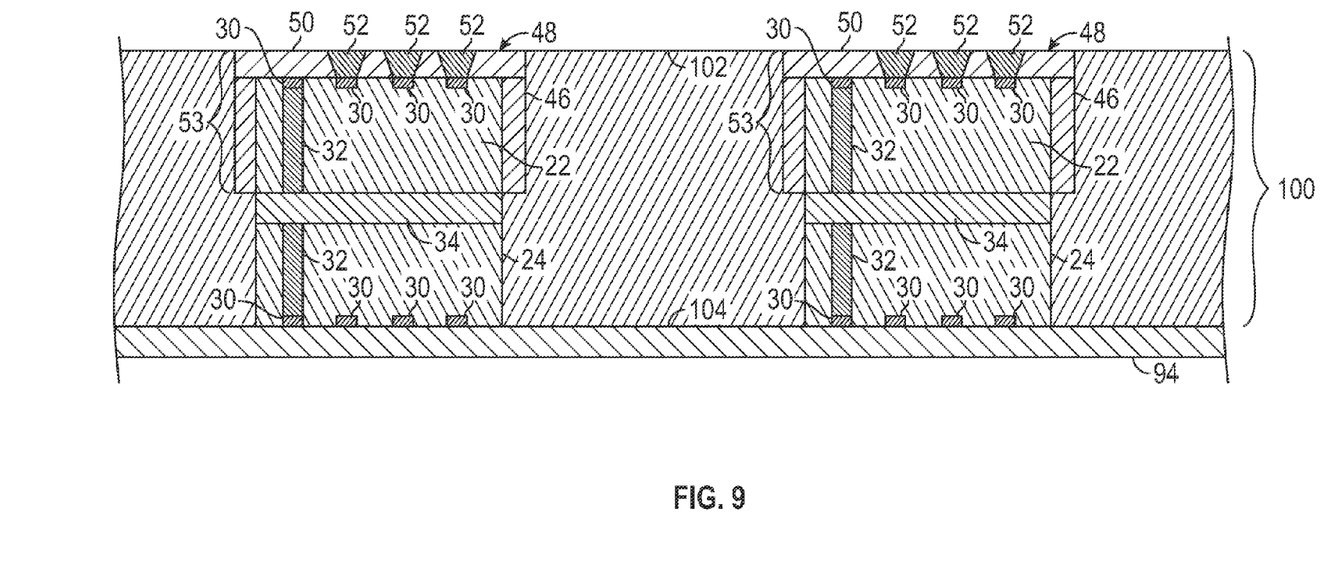

A final encapsulation or overmolding process is now performed during which upper package layers 53 and lower semiconductor die 24 are embedded within a molded panel. The final encapsulation process may be carried-out in essentially the same manner as previously described; that is, a mold compound may be dispensed over package layers 53 and the various die 24 placed onto temporary substrate 94 and then cured to produce a molded panel. The resultant structure is shown in FIG. 8 wherein the molded panel is identified by reference numeral "100" and only partially shown. Molded panel 100 may be produced utilizing the same mold compound utilized to produce molded panel 84 (FIGS. 3-5) or a different mold compound. Molded panel 100 includes a frontside 102 and an opposing backside 104. Following panelization, upper package layers 53 and, thus, interconnect buffer layers 48 are covered by frontside 102 of molded panel 100. A planarization process is thus carried-out to remove material from panel frontside 102 and thereby expose interconnect buffer layers 48 therethrough. Planarization can be carried-out utilizing any process suitable for removing a predetermined thickness from molded panel 100, while imparting frontside 102 with a substantially planar surface. In preferred embodiments, a CMP or grinding process is utilized. FIG. 9 illustrates molded panel 100 after the performance of such a planarization process and exposure of interconnect buffer layers 48 through newly-planarized frontside 102 of molded panel 100. The amount of material removed from molded panel 100 will vary amongst embodiments, as will the final thickness of panel 100. In one embodiment, molded panel 100 has a final thickness between about 100 and about 3000 µm after planarization; although the final thickness of panel 100 can be thicker or thinner than the aforementioned range in further embodiments.

Figure 10:
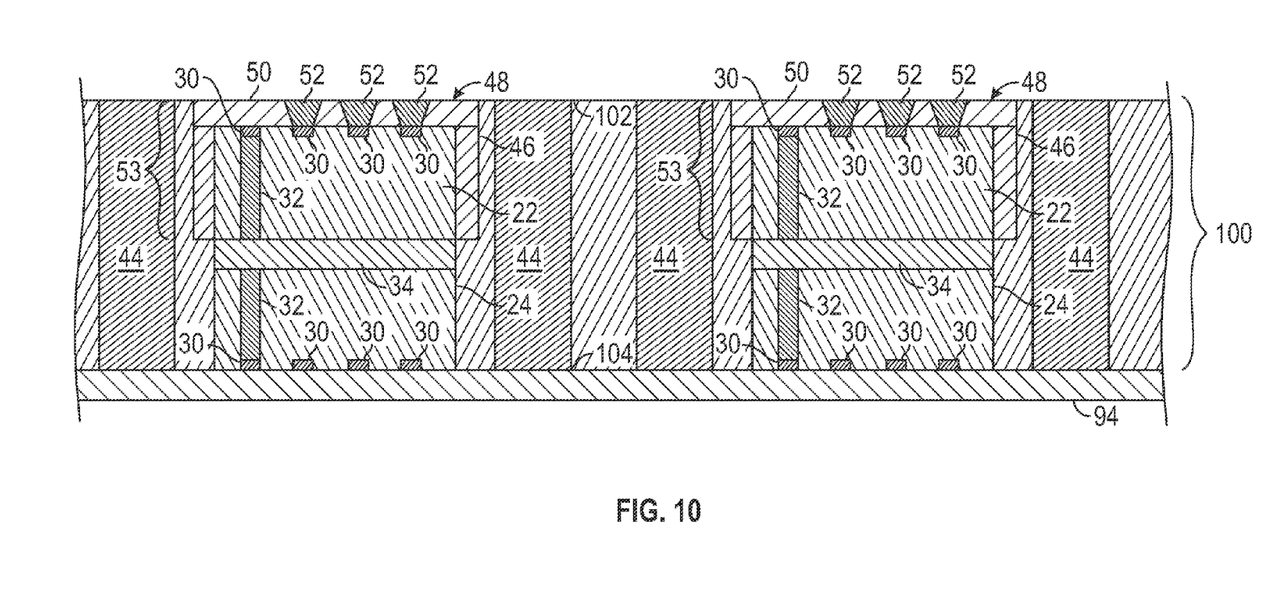
Figure 11:
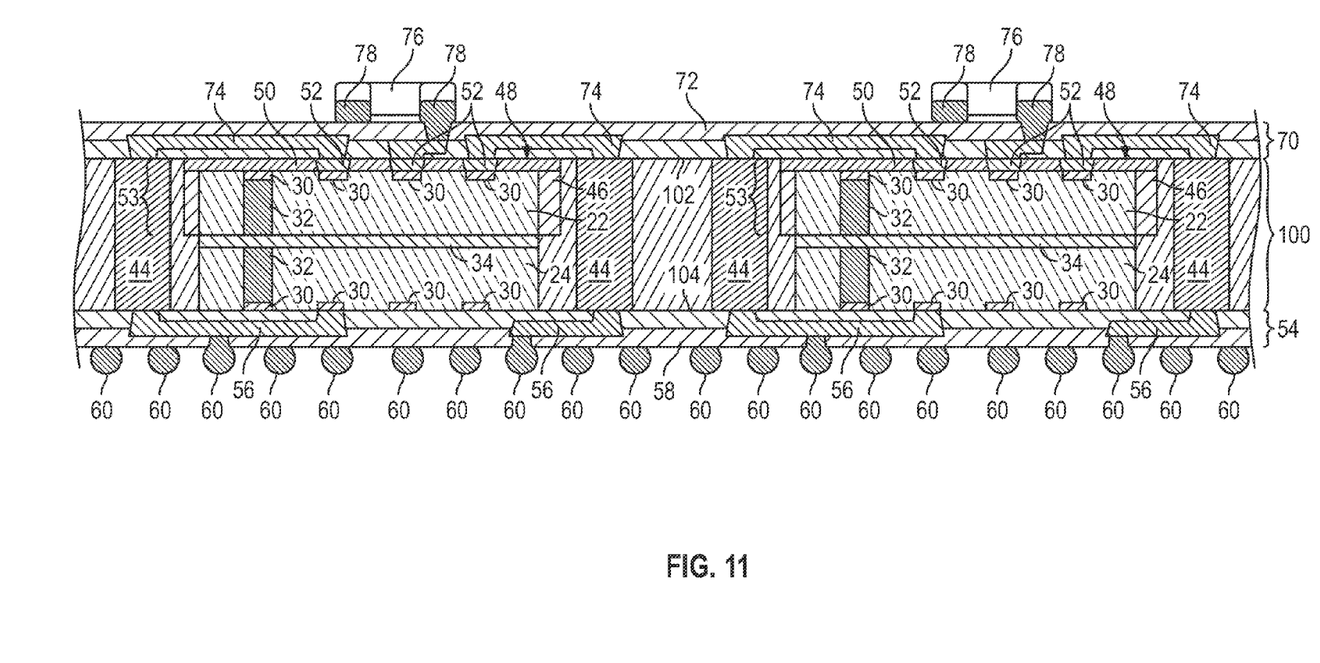

Additional processing of molded panel 100 is now performed to complete fabrication of the microelectronic packages. For example, one or more TPVs 44 may be formed through molded panel 100, as generally illustrated in FIG. 10. TPVs 44 may be produced by laser drilling or otherwise forming vertical tunnels through the body of panel 100 and subsequently backfilling the tunnels with an electrically-conductive paste. Afterwards, RDL layers 54 and 70 may be successively built over frontside 102 and backside 104 of panel 100, respectively. The respective dielectric bodies 58 and 72 of RDL layers 54 and 70 may each be produced as a number of successively-deposited (e.g., spun-on) dielectric layers. Backside interconnect lines 56 and frontside interconnect lines 74 and may be formed within dielectric bodies 58 and 72, respectively, utilizing well-known lithographical patterning and conductive-material deposition processes. BGA 60 may then be produced over backside RDL layers 54 utilizing a bumping process. After or prior to formation of BGA 60, SMDs 76 may be mounted to frontside RDL layers 70 by forming openings within the outermost frontside RDL layer 70 exposing selected regions of interconnect lines 74, depositing globs of solder paste into the openings, and then placing the terminals of SMDs 76 in contact with the deposited globs of solder paste. Finally, to complete fabrication of the microelectronic packages, molded panel 100 is singulated using, for example, a dicing saw, laser cutting, or another dicing technique. This results in the production of a number of microelectronic packages substantially identical to microelectronic package 20 shown in FIG. 1. As previously indicated, the singulated piece of molded panel 100 included within each completed microelectronic package 20 defines outer package body 38 identified in FIG. 1 and described in detail above.

It should thus be appreciated that there has been provided a method for producing FO-WLP microelectronic packages having relatively high device densities and relatively high levels of interconnectivity. While, in the above described example, the device stack (e.g., semiconductor die stack 22, 24) contained two semiconductor die positioned in a back-to-back relationship, it is emphasized that the device stack may contain other microelectronic devices in addition semiconductor die 22 and 24. For example, in further embodiments, the device stack may include two or more semiconductor die contained within upper package layer 53. This may be more fully appreciated by referring to FIG. 12, which illustrates a microelectronic package 110 illustrated in accordance with a further exemplary embodiment of the present invention. In many respects, microelectronic package 110 is similar to microelectronic package 20 described above in conjunction with FIGS. 1-11. However, in contrast to package 20 (FIGS. 1-11), microelectronic package 110 includes an upper package layer 112 containing two adjacent semiconductor die 114 and 116, which are embedded within an inner molded body 118. Upper semiconductor die 114 and 116 may be bonded to the backside 28 of lower semiconductor die 24 by a layer of die attach material 34 when upper package layer 110 is stacked onto die 24. Inner molded body 118, upper semiconductor die 114, and upper semiconductor die 116 are overlaid by an interconnect buffer layer 120, which provides electrical connection to overlying frontside RDL layers 70.

Figure 12:
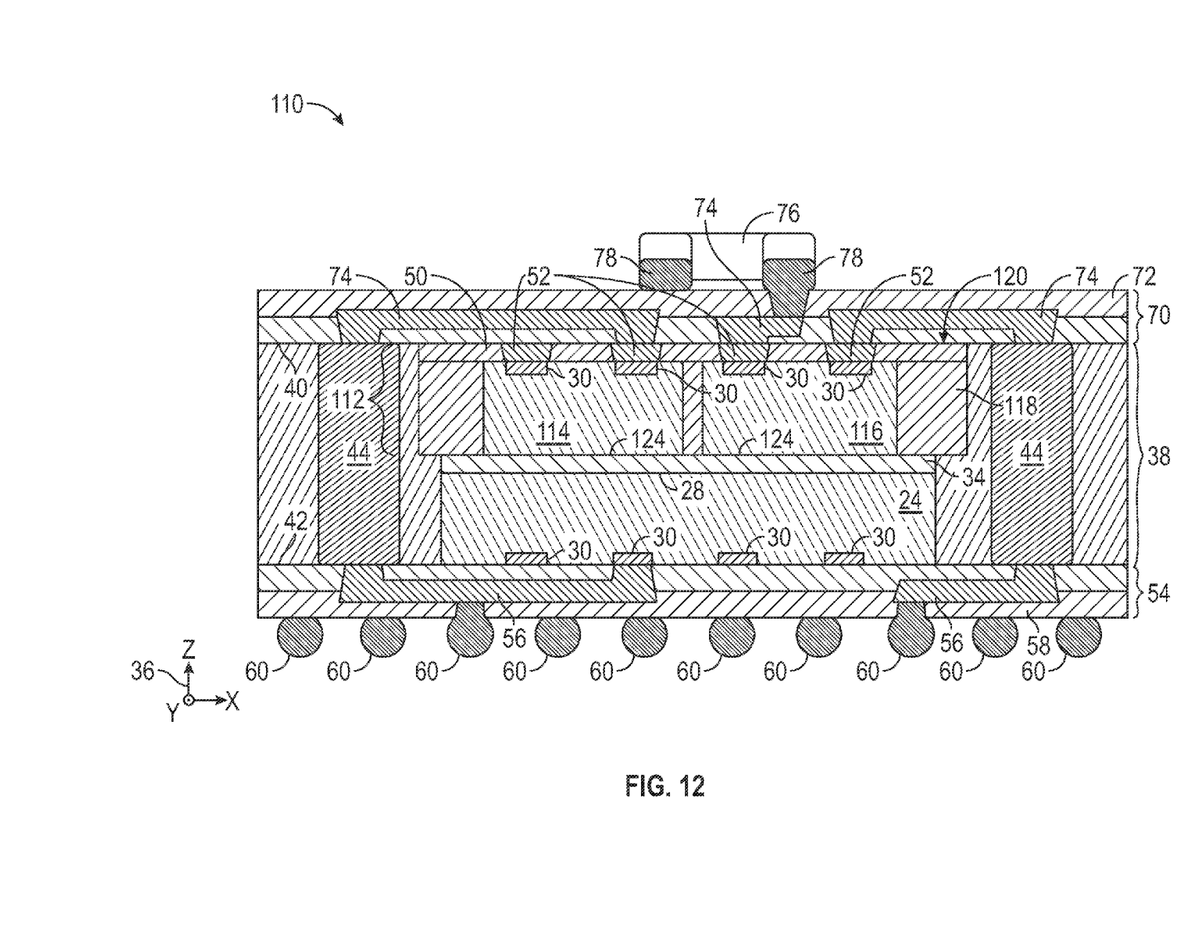
FIG. 12 is a cross-sectional view of a microelectronic package including a device stack embedded within an outer molded body and having an upper package layer containing multiple semiconductor die, as illustrated in accordance with a further exemplary embodiment of the present invention.
Figure 13:
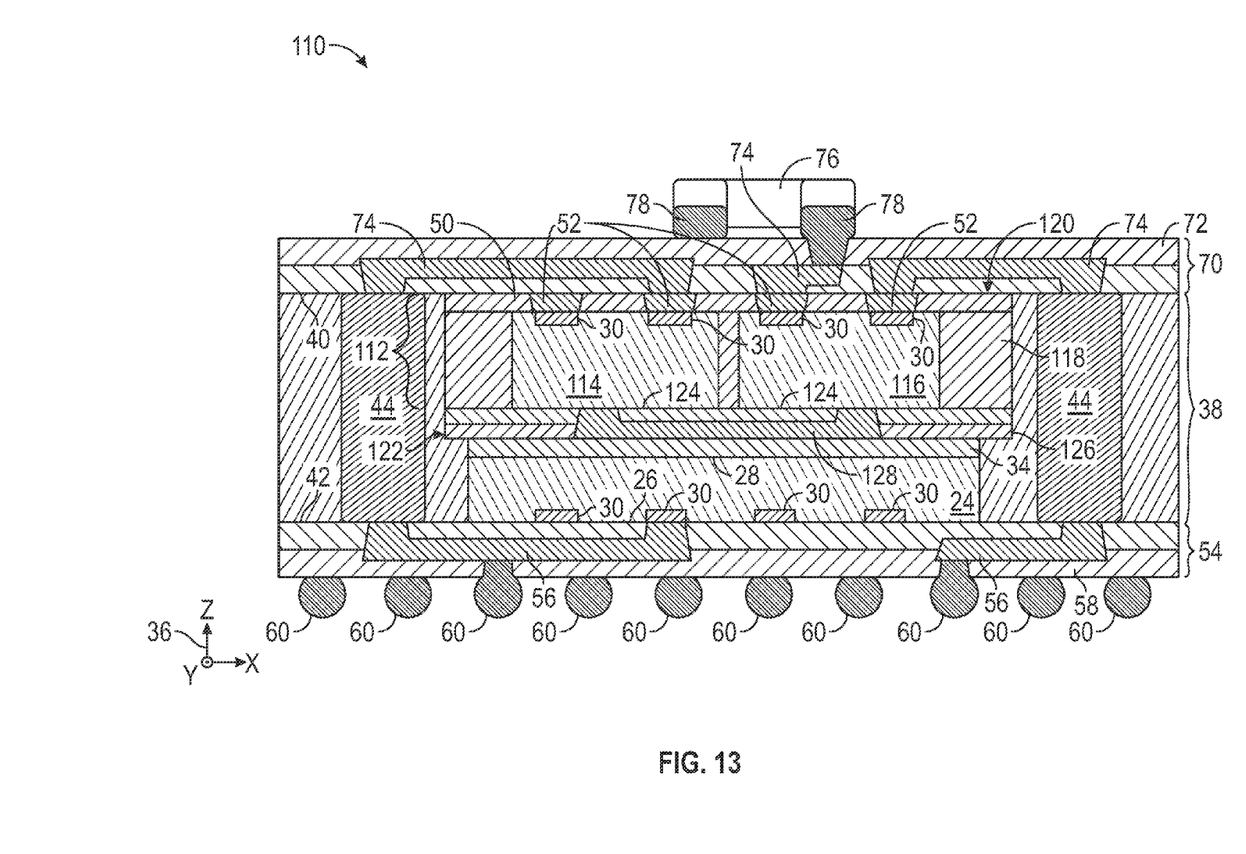
FIG. 13 is a cross-sectional view of a microelectronic package similar to the microelectronic package shown in FIG. 12, but further including an intermediate device-to-device interconnect layer electrically coupling the semiconductor die contained within the upper package layer of the device stack, as illustrated in accordance with a still further exemplary embodiment of the present invention.

With continued reference to the exemplary embodiment illustrated in FIG. 12, semiconductor die 114 and 116 may be interconnected by interconnect lines 74 within frontside RDL layers 70. Additionally or alternatively, as shown in FIG. 13, microelectronic package 110 may be produced to include one or more buried device-to-device interconnect layers 122 across which die 114 and 116 may be electrically coupled. Buried interconnect layers 122 may be formed under the respective backsides 124 of die 114 and 116, and extend over the lower surface of inner molded body 118. During fabrication of package 110, interconnect layers 122 may be produced immediately following encapsulation of semiconductor die 114 and 116 in an initial molded panel and the planarization performed to expose the backsides of die 114 and 116 therethrough; e.g., immediately after the planarization process shown in FIG. 4. Buried interconnect layer 122 may be produced in essentially the same manner as are RDL layers 54 and 70. In this case, buried interconnect layers 122 may include one or more dielectric layers 126 in which one or more interconnect lines 128 are produced to electrically couple electrically-conductive features provided on the respective backsides 124 of die 114 and 116. In further embodiments, an interposer or other pre-routing structure can be utilized in place of buried interconnect layers 122. When present, buried interconnect layers 122 may be bonded to the backside 28 of lower die 24 utilizing a layer of die attach material 34, as generally shown in FIG. 12.

There has thus been described multiple exemplary embodiments of a FO-WLP microelectronic package containing a device stack, which may be highly interconnected and embedded within relatively compact molded body. Embodiments of fabrication method for manufacture such FO-WLP microelectronic packages have also been described. In one embodiment, the method comprises encapsulating a device stack within a molded panel having a frontside and a backside. The device stack includes an upper semiconductor die and an interconnect buffer layer, which is formed over the upper semiconductor die and which is covered by the frontside of the molded panel. Material is removed from the frontside the molded panel utilizing, for example, a grinding, CMP, or other planarization process to expose the interconnect buffer layer therethrough. One or more frontside RDL layers are produced over the frontside of the molded panel and electrically coupled to the upper semiconductor die through the interconnect buffer layer. The molded panel is then singulated to yield a microelectronic package including a molded package body containing the device stack.

In a further embodiment, the fabrication method includes the step/process of bonding an upper package layer to a lower microelectronic device to produce a device stack. The upper package layer may include an inner molded body; at least one upper microelectronic device, which is surrounded by the inner molded body; and an interconnect buffer layer, which is formed over the inner molded body and over the at least one upper microelectronic device. The device stack is encapsulated within a molded panel having a frontside and a backside through which the lower microelectronic device is exposed. The frontside of the molded panel is ground, polished, or otherwise planarized to reveal the interconnect buffer layer therethrough. One or more frontside RDL layers are then built-up over the frontside of the molded panel and electrically coupled to the at least one upper microelectronic device through the interconnect buffer layer. Finally, the molded panel is singulated to yield a microelectronic package including a molded package body containing the device stack.

In a further embodiment, there is provided a microelectronic package including a device stack. The device stack includes, in turn: (i) a lower microelectronic device; (ii) a first upper microelectronic device positioned over the lower microelectronic device; (iii) an inner molded body surrounding the first upper microelectronic device; and (iv) an interconnect buffer layer disposed over the first upper microelectronic device and the inner molded body. The microelectronic package further includes an outer molded body in which the device stack is embedded. One or more frontside RDL layers are disposed over a frontside of the outer molded body and electrically coupled to the first upper microelectronic device through the interconnect buffer layer. Similarly, one or more backside RDL layers are disposed over a backside of the outer molded body and electrically coupled to the lower microelectronic device. At least one contact array electrically, such as a frontside BGA and/or a backside BGA, is coupled to lower microelectronic device through the backside redistribution layers and to the upper microelectronic device through the frontside redistribution layers and the interconnect buffer layer.

While at least one exemplary embodiment has been presented in the foregoing Detailed Description, it should be appreciated that a vast number of variations exist. It should also be appreciated that the exemplary embodiment or exemplary embodiments are only examples, and are not intended to limit the scope, applicability, or configuration of the invention in any way. Rather, the foregoing Detailed Description will provide those skilled in the art with a convenient road map for implementing an exemplary embodiment of the invention. It being understood that various changes may be made in the function and arrangement of elements described in an exemplary embodiment without departing from the scope of the invention as set-forth in the appended claims.

What is claimed is:

1. A method for fabricating a microelectronic package, comprising:
    encapsulating a device stack within a molded panel having a frontside and a backside, the device stack comprising:
        an upper semiconductor die;
        an interconnect buffer layer formed over the upper semiconductor die and covered by the frontside of the molded panel; and
        an inner molded body surrounding the upper semiconductor die and underlying the interconnect buffer layer;
    removing material from the frontside the molded panel to expose the interconnect buffer layer therethrough;
    producing one or more frontside redistribution layers over the frontside of the molded panel and electrically coupled to the upper semiconductor die through the interconnect buffer layer; and
    singulating the molded panel to yield a microelectronic package including a molded package body containing the device stack and surrounding the inner molded body and the interconnect buffer layer.

2. The method of claim 1 wherein the device stack further comprises a lower semiconductor die positioned in a back-to-back relationship with the upper semiconductor die.

3. The method of claim 2 wherein the device stack further comprises a die attach layer bonding the backside of the upper semiconductor die to the backside of the lower semiconductor die.

4. The method of claim 3 wherein the upper semiconductor die is electrically coupled to the lower semiconductor die through the die attach layer.

5. The method of claim 1, further comprising:
    encapsulating the upper semiconductor die within an initial molded panel;
    forming the interconnect buffer layer over the initial molded panel;
    singulating the initial molded panel to yield an upper package layer including the inner molded body, the upper semiconductor die surrounded by the inner molded body, and the interconnect buffer layer overlying the inner molded body and the upper semiconductor die; and
    positioning the upper package layer over at least one lower microelectronic device to produce the device stack.

6. The method of claim 5 further comprising planarizing the backside of the initial molded panel to reveal the backside of the upper semiconductor die therethrough prior to forming the interconnect buffer layer.

7. The method of claim 1 wherein the upper semiconductor die comprises a frontside on which a plurality of bond pads is located, and wherein the interconnect buffer layer comprises:
    a dielectric film formed over the frontside of the semiconductor die; and
    a plurality of contacts extending through the dielectric film and in ohmic contact with the plurality of bond pads.

8. The method of claim 7 wherein the plurality of contacts comprises a plurality of plated pillars.

9. The method of claim 1 wherein removing material from the frontside the molded panel comprises planarizing the frontside of the molded panel to remove a predetermined thickness from the molded panel and impart the molded panel with a substantially planar frontside surface.

10. The method of claim 9 wherein a predetermined thickness is also removed form the interconnect buffer layer during planarization of the frontside of the molded panel.

11. The method of claim 1 wherein the device stack further comprises a lower microelectronic device, and wherein the method further comprises producing one or more backside redistribution layers over the backside of the molded panel and electrically coupled to the lower microelectronic device.

12. The method of claim 11 further comprising:
    forming at least one through package via through the molded panel after encapsulating the device stack therein; and
    producing a backside contact array over the backside redistribution layers prior to singulation of the molded panel;
    wherein the upper semiconductor die is electrically coupled to at least one of the lower microelectronic device and the backside contact array through the frontside redistribution layers, the through package via, and the backside redistributions layers.

13. The method of claim 1 wherein the inner molded body is produced prior to the outer molded body during an initial panelization and singulation process utilized to initially encapsulate the upper semiconductor die.

14. A method for fabricating a microelectronic package, comprising:
bonding an upper package layer to a lower microelectronic device to produce a device stack, the upper package layer comprising:
an inner molded body;
at least one upper microelectronic device surrounded by the inner molded body; and
an interconnect buffer layer formed over the inner molded body and over the at least one upper microelectronic device;
encapsulating the device stack within a molded panel having a frontside and a backside through which the lower microelectronic device is exposed;
planarizing the frontside of the molded panel to reveal the interconnect buffer layer therethrough;
producing one or more frontside redistribution layers over the frontside of the molded panel and electrically coupled to the at least one upper microelectronic device through the interconnect buffer layer; and
singulating the molded panel to yield a microelectronic package including an outer molded package body containing the device stack and formed around the inner molded body and the interconnect buffer layer.

15. The method of claim 14 wherein the at least one upper microelectronic device comprises:
a first upper microelectronic device encapsulated within the inner molded body; and
a second upper microelectronic device encapsulated within the inner molded body adjacent the first upper microelectronic device.

16. The method of claim 15 wherein the upper package layer further comprises a buried interconnect layer formed over the inner molded body opposite the interconnect buffer layer, the first and second upper microelectronic devices electrically coupled through the buried interconnect buffer layer.

17. The method of claim 15 wherein first and second upper microelectronic device comprise first and second semiconductor die, respectively, and wherein the buried interconnect buffer layer electrically couples an electrically-conductive feature on the backside of the first semiconductor die to an electrically-conductive feature on the backside of the second semiconductor die.

18. The method of claim 14 wherein the inner molded body is produced utilizing a first overmolding process, wherein the molded panel is produced utilizing a second overmolding process performed subsequent to the first overmolding process, and wherein the inner molded body comprises a singulated piece of a molded panel produced pursuant to the first overmolding process.

19. A microelectronic package, comprising:
a device stack, comprising:
a lower microelectronic device;
a first upper microelectronic device positioned over the lower microelectronic device;
an inner molded body surrounding the first upper microelectronic device;
an interconnect buffer layer disposed over the first upper microelectronic device and the inner molded body;
an outer molded body in which the device stack is embedded, the outer molded body formed around the inner molded body and the interconnect buffer layer;
one or more frontside redistribution layers disposed over a frontside of the outer molded body and electrically coupled to the first upper microelectronic device through the interconnect buffer layer;
one or more backside redistribution layers disposed over a backside of the outer molded body and electrically coupled to the lower microelectronic device; and
at least one contact array electrically coupled to the lower microelectronic device through the backside redistribution layers and to the upper microelectronic device through the frontside redistribution layers and the interconnect buffer layer.

20. The microelectronic package of claim 19 wherein the device stack further comprises a second upper microelectronic device embedded within the inner molded body adjacent the first microelectronic device.

* * * * *